(12) United States Patent
Shih et al.

(10) Patent No.: US 9,526,171 B2
(45) Date of Patent: Dec. 20, 2016

(54) PACKAGE STRUCTURE AND FABRICATION METHOD THEREOF

(71) Applicant: Siliconware Precision Industries Co., Ltd., Taichung (TW)

(72) Inventors: Chi-Liang Shih, Taichung (TW); Hsin-Lung Chung, Taichung (TW); Te-Fang Chu, Taichung (TW); Hao-Ju Fang, Taichung (TW); Kuang-Neng Chung, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/564,180

(22) Filed: Dec. 9, 2014

(65) Prior Publication Data

US 2015/0366085 A1 Dec. 17, 2015

(30) Foreign Application Priority Data

Jun. 13, 2014 (TW) .............................. 103120464 A

(51) Int. Cl.
| | |
|---|---|
| *H01L 23/10* | (2006.01) |
| *H05K 1/11* | (2006.01) |
| *H01L 23/31* | (2006.01) |
| *H01L 21/56* | (2006.01) |

(52) U.S. Cl.
CPC .......... *H05K 1/111* (2013.01); *H01L 23/3128* (2013.01); *H01L 21/565* (2013.01); *H01L 2224/16225* (2013.01); *H01L 2224/48091* (2013.01); *H01L 2924/181* (2013.01); *H01L 2924/1815* (2013.01)

(58) Field of Classification Search
CPC ........ A01B 12/006; H01L 33/00; H01L 29/22; H05K 13/0023; H05K 1/181; H05K 1/111
USPC .......................................... 257/704, 706, 98
See application file for complete search history.

(56) References Cited

U.S. PATENT DOCUMENTS

| | | | | |
|---|---|---|---|---|
| 4,386,821 A | * | 6/1983 | Simon | G02B 6/421 257/E31.118 |
| 4,439,006 A | * | 3/1984 | Stevenson | G02B 6/4292 257/432 |
| 6,188,132 B1 | * | 2/2001 | Shih | H01S 5/02252 257/706 |
| 6,410,904 B1 | * | 6/2002 | Ito | G02B 7/02 250/214 R |
| 6,670,599 B2 | * | 12/2003 | Wagner | H01L 31/12 250/214.1 |
| 6,798,054 B1 | * | 9/2004 | Lo | H01L 25/105 257/685 |
| 6,836,491 B2 | * | 12/2004 | Itoh | G11B 7/22 372/36 |
| 6,954,475 B2 | * | 10/2005 | Chida | H01S 5/02212 372/109 |
| 8,008,769 B2 | * | 8/2011 | Tseng | H01L 21/565 257/718 |

(Continued)

*Primary Examiner* — Tuan Nguyen
(74) *Attorney, Agent, or Firm* — Mintz Levin Cohn Ferris Glovsky and Popeo, P.C.; Peter F. Corless; Steven M. Jensen

(57) ABSTRACT

A package structure is provided, which includes: a substrate having opposite first and second surfaces; at least an electronic element disposed on the first surface of the substrate; and an encapsulant formed on the first surface of the substrate for encapsulating the electronic element. The encapsulant has a non-rectangular shape so as to reduce an ineffective space in the encapsulant.

11 Claims, 8 Drawing Sheets

(56) References Cited

U.S. PATENT DOCUMENTS

2016/0081234 A1* 3/2016 Chiu .................... H05K 9/0022
361/818

* cited by examiner

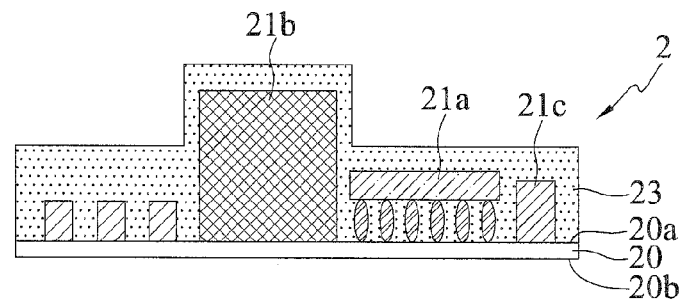
FIG. 2C
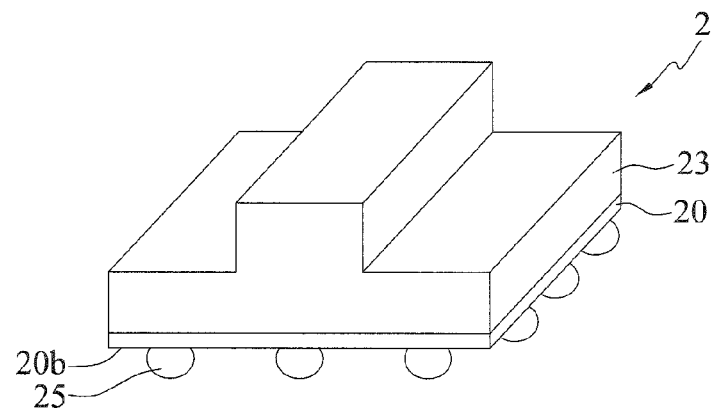
FIG. 2C'
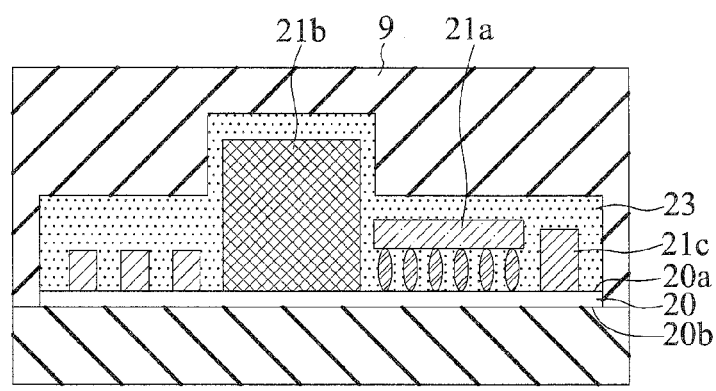
FIG. 2C"

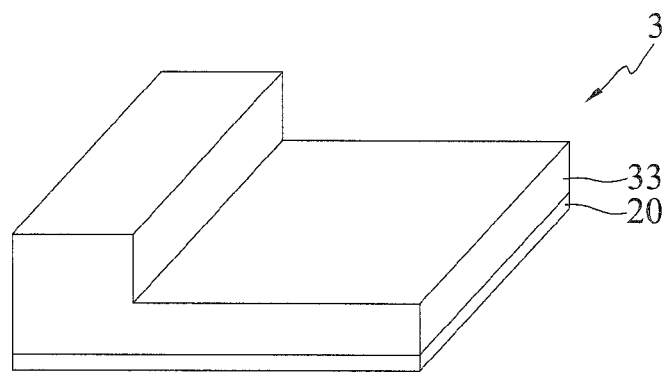
FIG. 3A
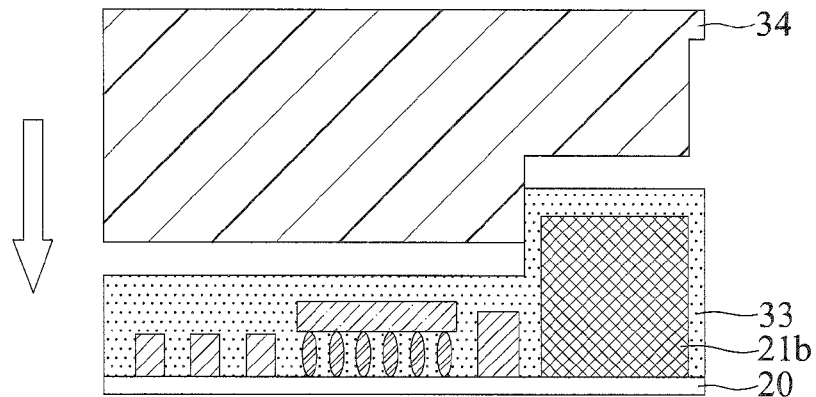
FIG. 3A'
FIG. 3A"

PACKAGE STRUCTURE AND FABRICATION METHOD THEREOF

CROSS-REFERENCES TO RELATED APPLICATIONS

This application claims under 35 U.S.C. §119(a) the benefit of Taiwanese Application No. 103120464, filed Jun. 13, 2014 the entire contents of which is incorporated herein by reference.

BACKGROUND OF THE INVENTION

1. Field of the Invention

The present invention relates to package structures and fabrication methods thereof, and more particularly, to a package structure having a non-rectangular shape and a fabrication method thereof.

2. Description of Related Art

Along with the progress of semiconductor packaging technologies, various package types have been developed for semiconductor devices. As electronic products are developed toward the trend of miniaturization and high operational speed, electrical performances and capacities of single semiconductor package structures need to be improved. Accordingly, multichip modules are designed for semiconductor package structures. Such a packaging method allows merging of heterogeneous technologies in a system-in-package (SiP) so as to systematically integrate a plurality of electronic elements having different functions, such as a memory, a CPU (Central Processing Unit), a GPU (Graphics Processing Unit), an image application processor and so on. As such, two or more chips are integrated in a single package structure, which not only reduces the overall size of the electronic product, but also improves the electrical performance. That is, the limit on the system operational speed is minimized Further, the multichip package structure shortens interconnection length between chips and reduces signal delay and access time.

FIG. 1 is a perspective view of a conventional package structure 1, and FIGS. 1A to 1C are schematic cross-sectional views showing the package structure 1 in different configurations. Referring to FIG. 1 and FIGS. 1A to 1C, the package structure 1 has: a substrate 10, a plurality of electronic elements 11a, 11b, 11c disposed on the substrate 10, and an encapsulant 13 encapsulating the electronic elements 11a, 11b, 11c. The substrate 10 is a circuit board and has a rectangular shape. The electronic elements 11a, 11b, 11c are disposed on and electrically connected to the substrate 10.

In the package structure 1, the encapsulant 13 is of a rectangular shape and has a large ineffective space S. That is, no electronic elements or circuits are formed in the space S. The ineffective space S increases the size of the package structure 1 and reduces the packaging density. Consequently, the final product cannot meet the miniaturization requirement.

Further, during a subsequent assembling process, the design of an external component (not shown) will be limited by the shape of the encapsulant 13 and cannot be changed according to the practical need, thus reducing the design flexibility.

Therefore, how to overcome the above-described drawbacks has become critical.

SUMMARY OF THE INVENTION

In view of the above-described drawbacks, the present invention provides a package structure, which comprises: a substrate having opposite first and second surfaces; at least an electronic element disposed on the first surface of the substrate; and an encapsulant formed on the first surface of the substrate for encapsulating the electronic element, wherein the encapsulant has a non-rectangular shape.

The present invention further provides a method for fabricating a package structure, which comprises the steps of: providing a substrate having opposite first and second surfaces and at least an electronic element disposed on the first surface; and forming an encapsulant on the first surface of the substrate for encapsulating the electronic element, wherein the encapsulant has a non-rectangular shape.

In an embodiment, forming the encapsulant comprises: forming a rectangular-shaped encapsulant on the first surface of the substrate; and removing a portion of the rectangular-shaped encapsulant so as to form the non-rectangular shaped encapsulant.

In another embodiment, forming the encapsulant comprises: providing a mold; disposing the substrate and the electronic element in the mold; forming the non-rectangular shaped encapsulant in the mold; and removing the mold.

In the above-described package structure and method, the substrate can have a non-rectangular shape. In an embodiment, when a portion of the encapsulant is removed, the substrate under the portion of the encapsulant is also removed so as to form a non-rectangular shaped substrate.

In the above-described package structure and method, the first surface of the substrate can be partially exposed from the encapsulant.

In the above-described package structure and method, the number of the electronic element can be more than one and at least two of the electronic elements can have different heights relative to the first surface of the substrate.

In the above-described package structure and method, the encapsulant can have a top surface to be in contact with an external component, and the top surface can be a discontinuous plane.

In the above-described package structure and method, an external component can further be disposed on the encapsulant. The external component and the encapsulant can have complementary shapes so as to engage with one another. The external component can be a screen, an electronic module or a battery.

Therefore, by forming a non-rectangular shaped encapsulant, the present invention reduces an ineffective space in the encapsulant. As such, the present invention reduces the size of the package structure and increases the packaging density, thus reducing the size of the final product and meeting the miniaturization requirement of electronic products.

Further, during a subsequent assembling process, the design of an external component is not limited by the shape of the encapsulant. That is, the design of the external component can be changed according to the practical need so as to improve the design flexibility.

Figure 1:
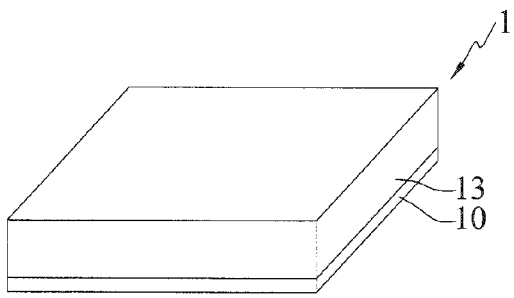
FIG. 1 is a schematic perspective view of a conventional package structure.
Figure 1A:
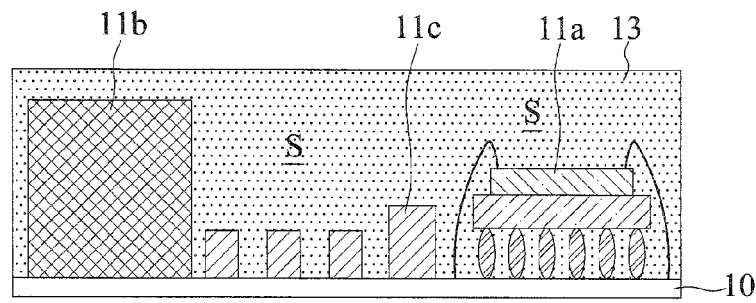
FIGS. 1A to 1C are schematic cross-sectional views showing different examples of a conventional package structure.
Figure 1B:
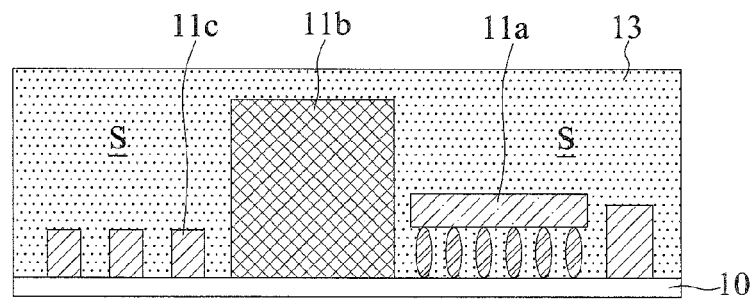
Figure 1C:
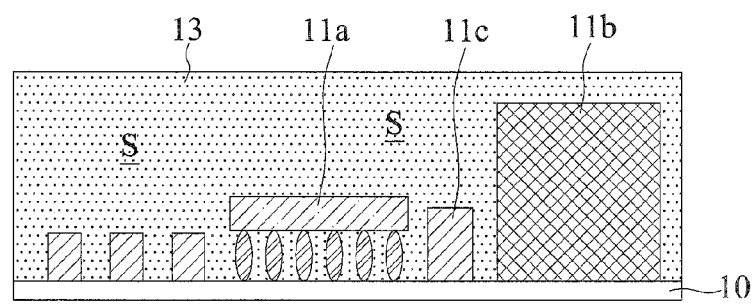
Figure 2A:
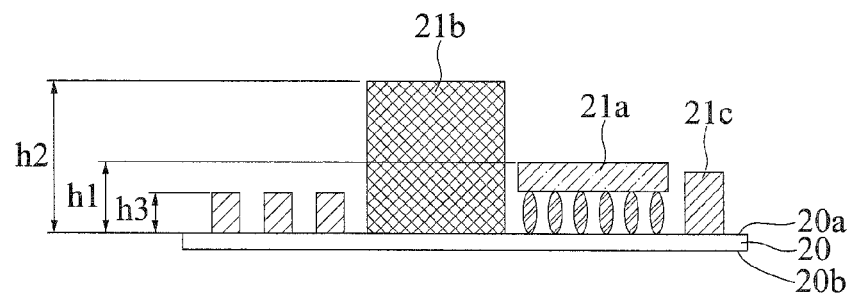
FIGS. 2A to 2C are schematic cross-sectional views showing a method for fabricating a package structure according to a first embodiment of the present invention, wherein FIG. 2B' is a schematic perspective view of FIG.
Figure 2B:
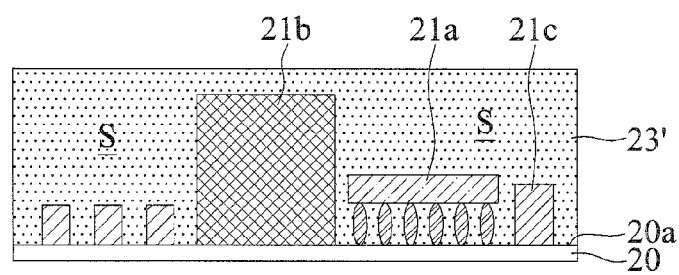
Figure 2B:
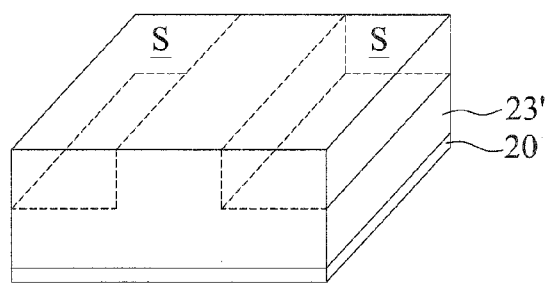
Figure 2D:
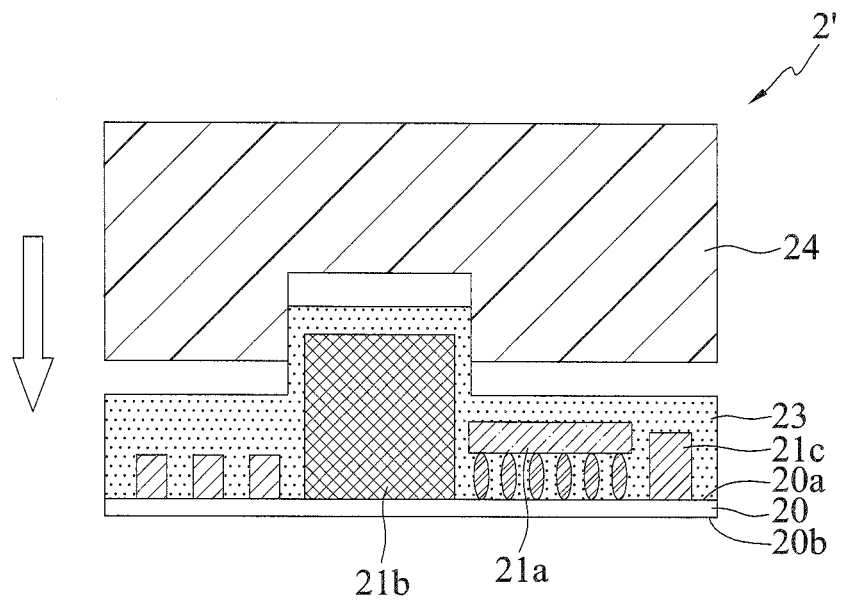
Figure 2D:
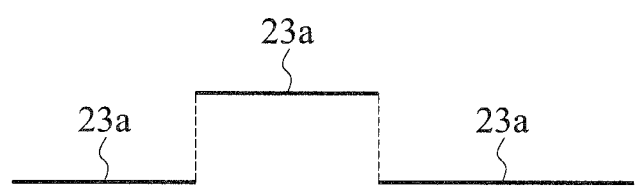
Figure 3B:
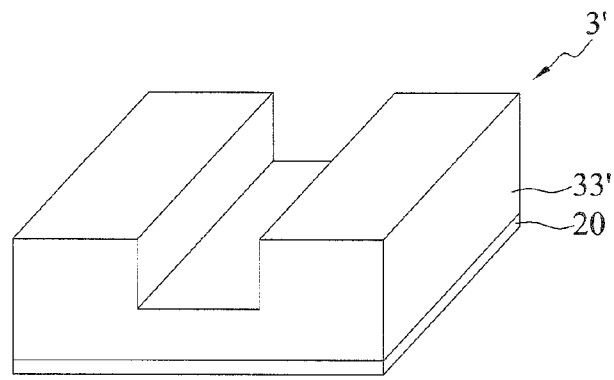
Figure 3B:
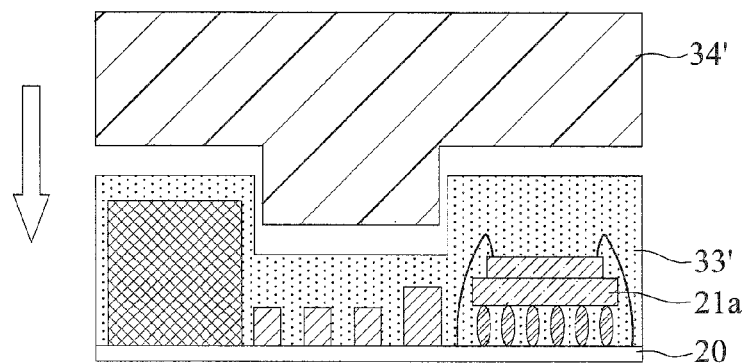
Figure 3C:
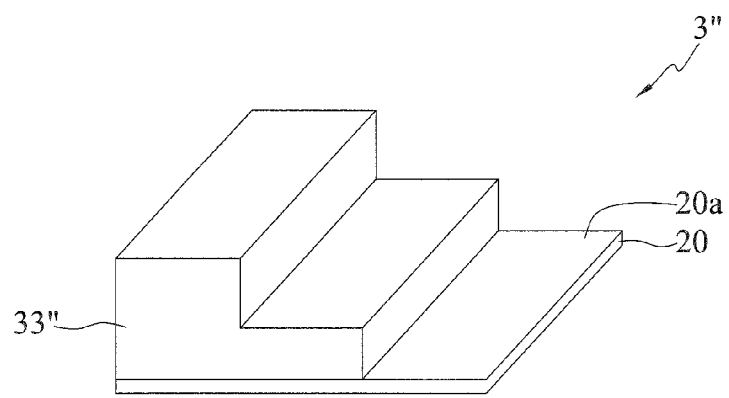
Figure 4A:
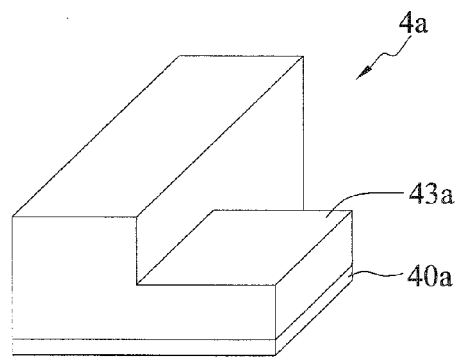
Figure 4A:
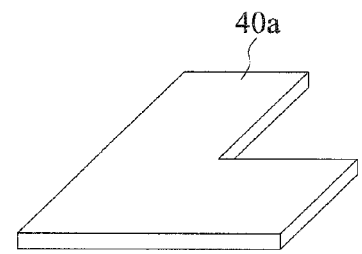
Figure 4B:
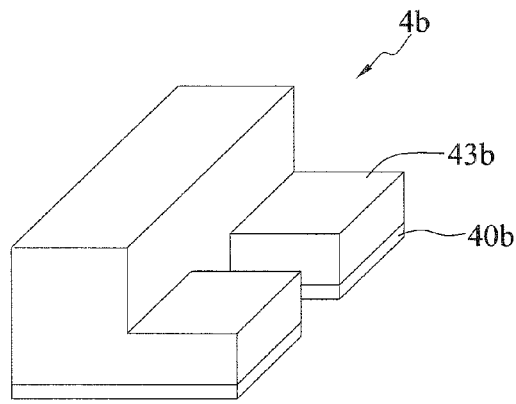
Figure 4B:
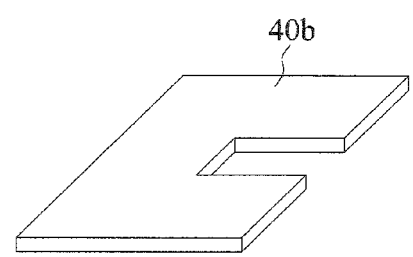
Figure 4C:
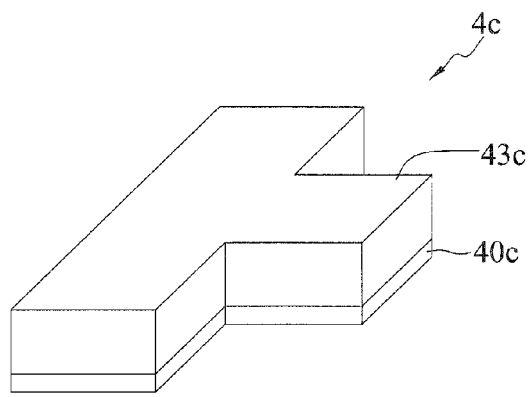
Figure 4C:
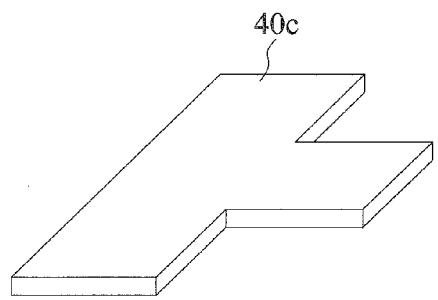
Figure 5:
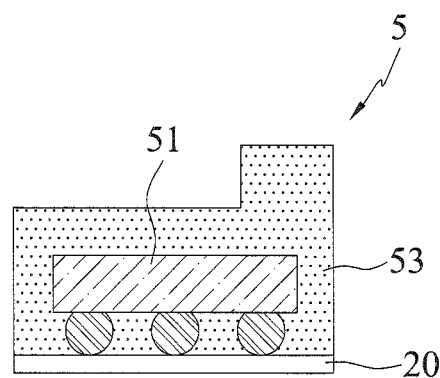

2B, FIG. 2C' is a schematic perspective view of FIG. 2C, and FIG. 2C" is schematic cross-sectional view showing another embodiment of FIG. 2C;

FIG. 2D is a schematic exploded cross-sectional view showing a process performed after the process of FIG. 2C, wherein FIG. 2D' is a schematic view of a top surface of the encapsulant of FIG. 2D;

FIGS. 3A and 3B are schematic perspective views of package structures according to a second embodiment of the present invention, wherein FIG. 3A' is a schematic exploded cross-sectional view showing another embodiment of FIG. 3A, FIG. 3A" is a schematic view of a top surface of the encapsulant of FIG. 3A, and FIG. 3B' is a schematic exploded cross-sectional view showing another embodiment of FIG. 3B;

FIG. 3C is a schematic perspective view of a package structure according to a third embodiment of the present invention;

FIGS. 4A to 4C are schematic perspective views of package structures according to a fourth embodiment of the present invention, wherein FIGS. 4A' to 4C' are schematic perspective views showing other embodiments of FIGS. 4A to 4C, respectively; and FIG. 5 is a schematic cross-sectional view showing a method for fabricating a package structure according to a fifth embodiment of the present invention.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2D are schematic cross-sectional views showing a method for fabricating a package structure 2, 2' according to a first embodiment of the present invention.

Referring to FIG. 2A, a substrate 20 having opposite first and second surfaces 20a, 20b is provided, and a plurality of electronic elements 21a, 21b, 21c are disposed on the first surface 20a of the substrate 20.

In the present embodiment, the substrate 20 is a circuit board or a ceramic board and has a rectangular shape. A plurality of circuits (not shown) are formed on the substrate 20 for electrically connecting the electronic elements 21a, 21b, 21c to the substrate 20.

The electronic elements 21a, 21b, 21c are active elements such as semiconductor elements (chips), passive elements such as resistors, capacitors and inductors, or a combination thereof. The electronic elements 21a, 21b, 21c are vertically stacked on the substrate 20 or horizontally disposed on the substrate 20.

Further, the electronic elements 21a, 21b, 21c have different heights h1, h2, h3 relative to the first surface 20a of the substrate 20.

Referring to FIG. 2B, an encapsulant 23' is formed on the first surface 20a of the substrate 20 for encapsulating the electronic elements 21a, 21b, 21c.

In the present embodiment, the encapsulant 23' has a rectangular shape, as shown in FIG. 2B'.

Referring to FIGS. 2C and 2C', a portion of the encapsulant 23' is removed and an encapsulant 23 having a non-rectangular shape is formed.

In the present embodiment, the portion of the encapsulant 23' is removed by grinding, cutting, etching or the like.

The removing process is performed according to the heights h1, h2, h3 of the electronic elements 21a, 21b, 21c. That is, an ineffective space S, as shown in FIGS. 2B and 2B', is removed to cause the encapsulant 23 to have a shape corresponding to the heights h1, h2, h3 of the electronic elements 21a, 21b, 21c.

Further, a shielding layer (not shown) is selectively formed on an inner or outer surface of the encapsulant 23 so as to prevent the electronic elements 21a, 21b, 21c from being adversely affected by external electromagnetic interferences (EMIs). Alternatively, a color layer (not shown) is formed on the outer surface of the encapsulant 23 to improve the visual effect of the package structure 2. In an embodiment, referring to FIG. 2C', a plurality of conductive elements 25, such as solder balls, are further formed on the second surface 20b of the substrate 20.

In another embodiment for forming a non-rectangular shaped encapsulant, referring to FIG. 2C", continued from FIG. 2A, the substrate 20 and the electronic elements 21a, 21b, 21c are disposed in a mold 9 and an encapsulant 23 having a non-rectangular shape is formed in the mold 9. Thereafter, the mold 9 is removed and a package structure 2 of FIG. 2C is obtained.

Referring to FIG. 2D, an external component 24 is disposed on the encapsulant 23 and a package structure 2' is obtained. The external component 24 is, for example, a screen, an electronic module or a battery.

In the present embodiment, the external component 24 and the encapsulant 23 have complementary shapes so as to engage with one another.

Further, the encapsulant 23 has a top surface 23a in contact with the external component 24, and the top surface 23a is a discontinuous plane, which is shown in bold lines in FIG. 2D'.

According to the present invention, a portion of the encapsulant 23' is removed to change the shape of the package structure 2 and reduce the ineffective space S. As such, the overall thickness of the package structure 2' having the external component 24 is minimized and the packaging density is increased. Therefore, the present invention meets the miniaturization requirement of electronic products.

FIGS. 3A and 3B are schematic perspective views of package structures 3, 3' according to a second embodiment of the present invention. The second embodiment differs from the first embodiment in the shape of the encapsulant 33, 33'. Referring to FIGS. 3A' and 3B', an external component 34, 34' has a shape complementary to the shape of the encapsulant 33, 33'. The top surface 33a of the encapsulant 33 to be in contact with the external component 34 is a discontinuous plane, which is shown in bold lines in FIG. 3B'.

FIG. 3C is a schematic perspective view of a package structure 3" according to a third embodiment of the present invention. The third embodiment differs from the first embodiment in the shape of the encapsulant 33".

Referring to FIG. 3C, the encapsulant 33" does not completely cover the first surface 20a of the substrate 20. That is, the first surface 20a of the substrate 20 is partially exposed from the encapsulant 33".

FIGS. 4A to 4C are schematic perspective views of package structures 4a, 4b, 4c according to a fourth embodiment of the present invention. The fourth embodiment differs from the first embodiment in the shape of the package structure 4a, 4b, 4c.

Referring to FIGS. 4A to 4C, when a portion of the encapsulant 23' is removed, the substrate 40a, 40b, 40c under the portion of the encapsulant 23' is also removed. As such, both the encapsulant 43a, 43b, 43c and the substrate 40a, 40b, 40c have a non-rectangular shape. For example, the shape of the encapsulant 43a, 43b, 43c corresponds to the shape of the substrate 40a, 40b, 40c.

In another embodiment, referring to FIGS. 4A' to 4C', a non-rectangular shaped substrate 40a, 40b, 40c is provided before the encapsulant 43a, 43b, 43c is formed.

FIG. 5 is a schematic cross-sectional view of a package structure 5 according to a fifth embodiment of the present invention. The fifth embodiment differs from the first embodiment in that only one electronic element 51 is provided in the package structure 5.

Referring to FIG. 5, a portion of the encapsulant 23' is removed to form a non-rectangular shaped encapsulant 53.

The present invention further provides a package structure 2, 2', 3, 3', 3", 4a, 4b, 4c, 5, which has: a substrate 20, 40a, 40b, 40c having opposite first and second surfaces 20a, 20b; at least an electronic element 21a, 21b, 21c, 51 disposed on the first surface 20a of the substrate 20, 40a, 40b, 40c; and an encapsulant 23, 33, 33', 33", 43a, 43b, 43c, 53 formed on the first surface 20a of the substrate 20, 40a, 40b, 40c for encapsulating the electronic element 21a, 21b, 21c, 51. The encapsulant 23, 33, 33', 33", 43a, 43b, 43c, 53 has a non-rectangular shape.

The electronic elements 21a, 21b, 21c, 51 can be active or passive elements and electrically connected to the substrate 20, 40a, 40b, 40c.

In an embodiment, the substrate 20, 40a, 40b, 40c has a non-rectangular shape.

In an embodiment, the number of the electronic element 21a, 21b, 21c is more than one and at least two of the electronic elements 21a, 21b, 21c have different heights h1, h2, h3 relative to the first surface 20a of the substrate 20.

In an embodiment, the first surface 20a of the substrate 20 is partially exposed from the encapsulant 33".

In an embodiment, the encapsulant 23, 33 has a top surface 23a, 33a to be in contact with an external component 24, 34 and the top surface 23a, 33a is a discontinuous plane.

In an embodiment, the package structure 2', 3, 3' further has an external component 24, 34, 34' disposed on the encapsulant 23, 33, 33'. The external component 24, 34, 34' and the encapsulant 23, 33, 33' have complementary shapes so as to engage with one another. The external component 24, 34, 34' can be a screen, an electronic module or a battery.

According to the present invention, a non-rectangular shaped encapsulant is formed to reduce an ineffective space in the encapsulant and increases the packaging density. Therefore, the present invention thins the thickness of electronic products and improves the design flexibility of an external component.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A package structure, comprising:
   a substrate having opposite first and second surfaces;
   a plurality of electronic elements disposed side by side on the first surface of the substrate, wherein at least two of the electronic elements have different heights relative to the first surface of the substrate; and
   an encapsulant formed on the first surface of the substrate for encapsulating the electronic elements, wherein the encapsulant has a non-rectangular shape corresponding to the heights of the electronic elements, and the encapsulant has a top surface composed of planes with different levels, at least a convex portion encapsulating the electronic element having a higher height relative to the first surface of the substrate and at least a concave portion encapsulating the electronic element having a lower height relative to the first surface of the substrate; and
   an external component in contact with the top surface of the encapsulant,
   wherein the external component and the encapsulant have complementary shapes so as to engage with one another.

2. The structure of claim 1, wherein the substrate has a non-rectangular shape.

3. The structure of claim 1, wherein the first surface of the substrate is partially exposed from the encapsulant.

4. The structure of claim 1, wherein the external component is a screen, an electronic module or a battery.

5. A method for fabricating a package structure, comprising the steps of:
   providing a substrate having opposite first and second surfaces and a plurality of electronic elements disposed side by side on the first surface, wherein at least two of the electronic elements have different heights relative to the first surface of the substrate; and forming an encapsulant on the first surface of the substrate for encapsulating the electronic element, wherein the encapsulant has a non-rectangular shape corresponding to the heights of the electronic elements, and the encapsulant has a top surface composed of planes with different levels, at least a convex portion encapsulating the electronic element having a higher height relative to the first surface of the substrate and at least a concave portion encapsulating the electronic element having a lower height relative to the first surface of the substrate; and
   disposing an external component in contact with the top surface of the encapsulant,
   wherein the external component and the encapsulant have complementary shapes so as to engage with one another.

6. The method of claim 5, wherein forming the encapsulant comprises:
   forming a rectangular-shaped encapsulant on the first surface of the substrate; and
   removing a portion of the rectangular-shaped encapsulant so as to form the non-rectangular shaped encapsulant.

7. The method of claim 5, wherein forming the encapsulant comprises:
   providing a mold;
   disposing the substrate and the electronic element in the mold;
   forming the non-rectangular shaped encapsulant in the mold; and
   removing the mold.

8. The method of claim 5, wherein the substrate has a non-rectangular shape.

9. The method of claim 5, wherein when a portion of the encapsulant is removed, the substrate under the portion of the encapsulant is also removed.

10. The method of claim 5, wherein the first surface of the substrate is partially exposed from the encapsulant.

11. The method of claim 5, wherein the external component is a screen, an electronic module or a battery.

* * * * *